(12) United States Patent
Yagisawa et al.

(10) Patent No.: US 7,046,100 B2
(45) Date of Patent: May 16, 2006

(54) DIRECT CURRENT CUT STRUCTURE

(75) Inventors: Takatoshi Yagisawa, Kawasaki (JP); Tadashi Ikeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/944,181

(22) Filed: Sep. 20, 2004

(65) Prior Publication Data

US 2005/0225408 A1    Oct. 13, 2005

(30) Foreign Application Priority Data

Apr. 8, 2004   (JP) ............................. 2004-114828

(51) Int. Cl.
*H03H 5/00*      (2006.01)
*H01G 4/38*      (2006.01)
(52) U.S. Cl. .................. 333/24 C; 333/245; 361/328
(58) Field of Classification Search .............. 333/24 C, 333/245; 361/283.3, 299.2, 298.4, 301.4, 361/309, 328, 330
See application file for complete search history.

(56) References Cited

U.S. PATENT DOCUMENTS

| 4,800,343 A | 1/1989 | Kinoshita et al. ......... 333/24 C |
| 2002/0105395 A1 | 8/2002 | Tajima ....................... 333/245 |

FOREIGN PATENT DOCUMENTS

| JP | 60-214601 | 3/1986 |
| JP | 5-235602 | 9/1993 |
| JP | 6-85511 | 3/1994 |
| JP | 2003-188047 | 7/2003 |

OTHER PUBLICATIONS

Search Report for corresponding European Appln. No. 04022477.6 dated Jun. 3, 2005.

*Primary Examiner*—Dean Takaoka
(74) *Attorney, Agent, or Firm*—Staas & Halsey LLP

(57) ABSTRACT

In the direct current cut structure of the present invention, two capacitors are provided in parallel between signal transmission line patterns facing each other on a substrate, and each of the two capacitors is electrically connected to each surface of each transmission line pattern that is exposed through a hole part provided on the substrate. It is preferable for the two capacitors to have different capacity. If there is no need to cover such a broad band, only one capacitor can also connected to either side of each transmission line pattern exposed through the hole part.

20 Claims, 10 Drawing Sheets

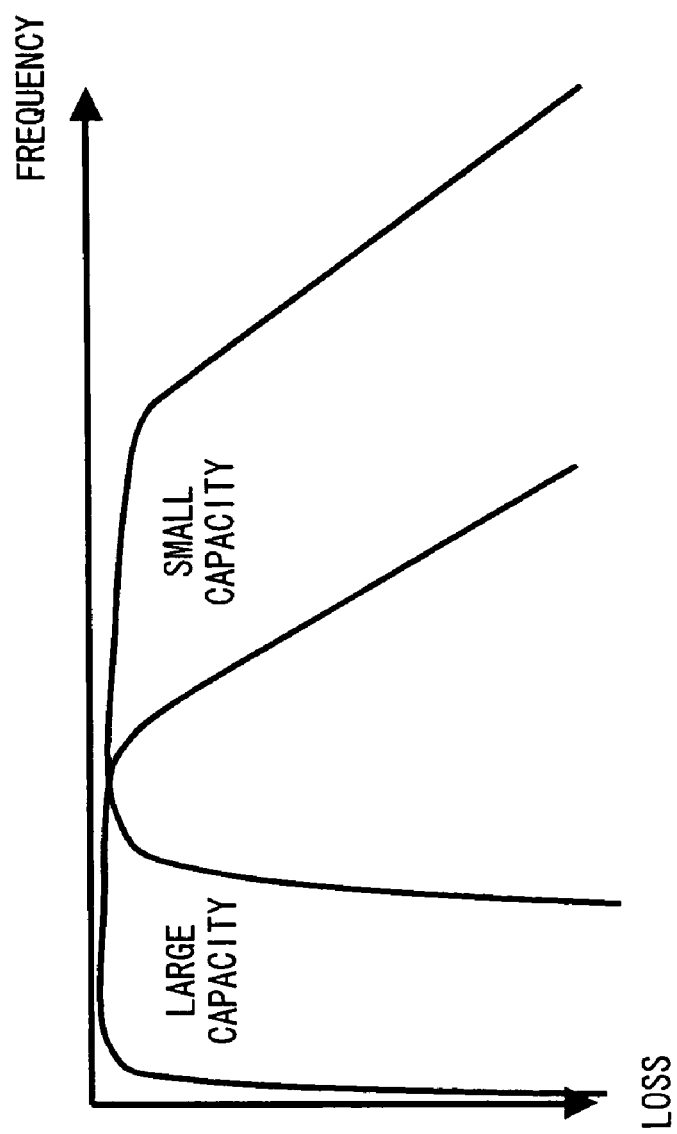
F I G. 1

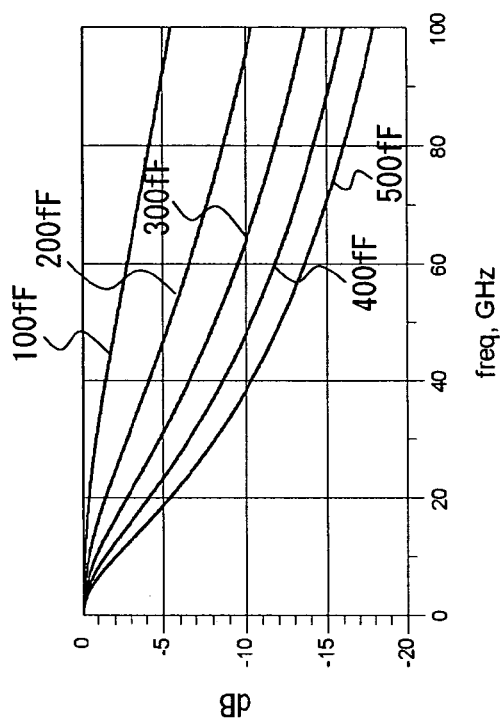
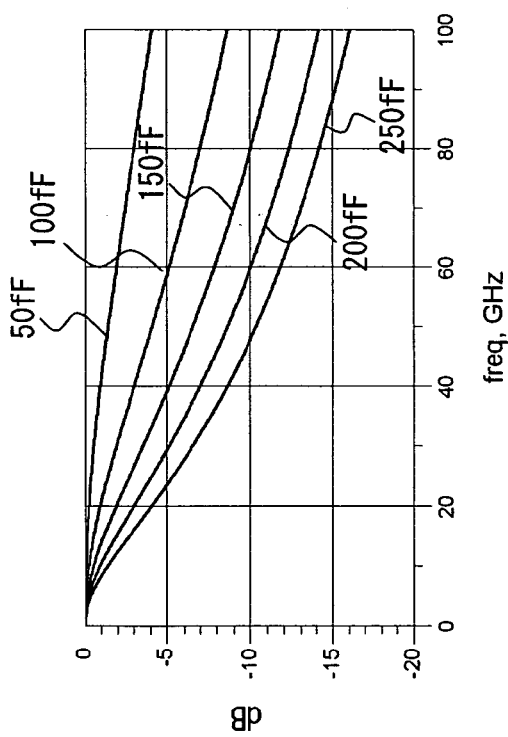
F I G. 5

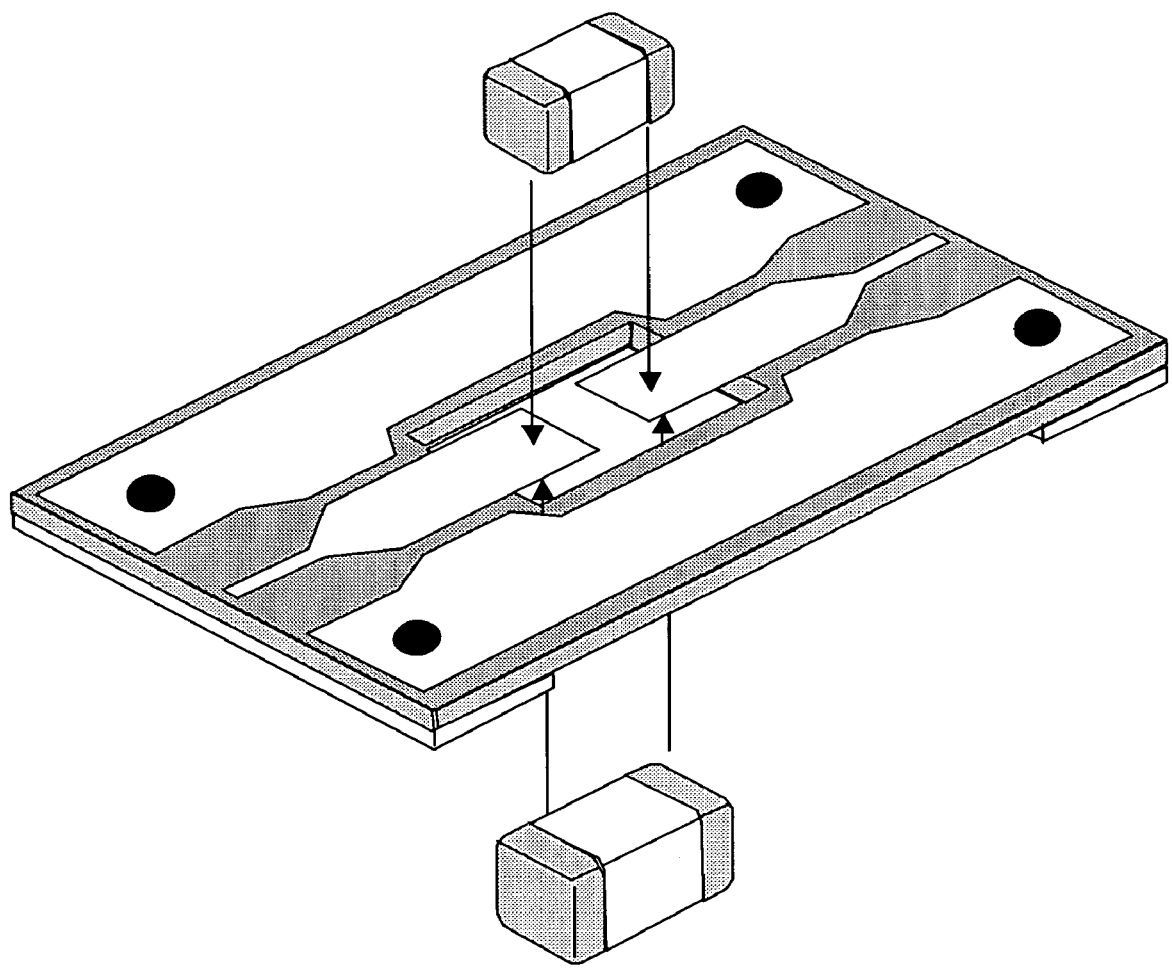
F I G. 9

DIRECT CURRENT CUT STRUCTURE

BACKGROUND OF THE INVENTION

1. Field of the Invention

The present invention relates to a direct current cut structure (hereinafter referred to as a DC cut structure) used to connect radio frequency (RF) electronic circuits, more particularly electronic circuits in which a desired frequency characteristic, such as a broadband characteristic which is used in an optical communication system and the like, is required or a variety of RF devices.

2. Description of the Related Art

The DC cut structure is used in RF electronic circuits, more particularly is used in electronic circuits in which a desired frequency characteristic, such as a broad band characteristic which is used in an optical communication system, is required or used in a variety of RF devices, for the connection between them.

If such a DC cut structure is incorporated, for example, between integrated circuits (IC) in an electronic circuit, signals transmitted/received between the ICs can be adjusted to respective required forms by cutting a direct current (DC) element. For example, if in one IC, the input of signals swung around the origin is presumed and in the other IC, the output at a high level or a low level located on one side when seen from the origin, such a DC cut structure is used for the transmission/reception of signals between the ICs.

For capacitors mounted on this DC cut structure, usually a broadband characteristic with the range of several kilo-hertz to several tens of giga-hertz is required. In order to respond to a request for such a broadband characteristic, in the DC cut structure, generally capacitors each with different capacity are connected in parallel between signal transmission line patters, and a broad band is realized by utilizing the difference in the frequency characteristic between the capacitors.

FIG. 1 shows the respective frequency characteristics of two capacitors used in the DC cut structure. As shown in FIG. 1, a capacitor with large capacity can suppress loss to a low level in a low frequency band, and a capacitor with small capacity can suppress loss to a low level in a high frequency band.

As the parallel connection technology of capacitors, the following several prior arts are known.

Firstly, in the first prior art disclosed in Patent Reference 1, a soldering pattern for disposing a plurality of capacitors on a pattern is provided, and by connecting the plurality of capacitors on the pattern, the parallel connection structure of capacitors is formed.

Next, in the second prior art disclosed in Patent Reference 2, as shown in FIG. 2, an RF micro-chip capacitor 41 with small capacity is connected to one pattern 42, and the other pattern 43 and the electrode unit of the micro-chip capacitor 41 are connected by an Au ribbon 44 or the like. Furthermore, a ceramic capacitor 45 is slantingly inserted between the microchip capacitor 41 and the pattern 42. Thus, the parallel connection structure of capacitors is formed.

In the third prior art disclosed in Patent Reference 3, a capacitor with small capacity is formed by approaching comb-shaped patterns facing each other on one surface of a substrate and another capacitor is provided on the other surface. Thus, the parallel connection structure of capacitors is formed.

Furthermore, in the fourth prior art, as shown in FIG. 3, capacitors 54 and 55 are mounted on the front and rear substrate patterns 51 and 52, respectively, which are connected by a veer 53. Thus, the parallel connection structure of capacitors is formed.

Patent Reference 1: Japanese Patent Laid-open Application No. 6-85511 "Mounting Structure of Broadband Coupler Circuit"

Patent Reference 2: Japanese Patent Laid-open Application No. 5-235602 "Transmission Line"

Patent Reference 3: Japanese Patent Laid-open Application No. 2003-188047 "DC Block Circuit and Communication Equipment"

FIG. 4 shows an equivalent circuit with a DC cut structure.

In such a DC cut structure of FIG. 4, parasitic capacitance due to disposing a capacitor on a pattern in a portion where capacitors are connected in parallel, and parasitic inductance mainly due to a line (for example, Au ribbon 44 shown in FIG. 2) used to connect capacitors occur. Then, in a transmission line whose distributed constant is, for example, 50 ohms, which is the usual application target of such a DC cut structure, these parasitic elements cause impedance mismatching. As a result, an RF characteristic degrades in such a transmission line, which is a problem.

FIG. 5 shows the simulation results of the influence on an RF characteristic of each parasitic element shown in FIG. 4.

The graph on the right side of FIG. 5 shows the relationship between the frequency (unit: GHz) and loss (unit dB) of a signal traveling through a transmission line pattern at each set value of a parasitic capacitance element (50 fF, 100 fF, 150 fF, 200 fF and 250 fF). It is seen from this right-side graph that in the case of the same parasitic capacitance value, the higher a frequency, the higher loss while in the case of same frequency, the larger a parasitic capacitance value, the higher loss. In other words, when compared in the same structure, the smaller a parasitic capacitance value, the smaller loss.

The graph on the left side of FIG. 5 shows the relationship between the frequency (unit: GHz) and loss (unit dB) of a signal traveling through a transmission line pattern at each set value of a parasitic inductance element (100 pH, 200 pH, 300 pH, 400 pH and 500 pH). It is seen from this left-side graph that in the case of the same parasitic inductance value, the higher a frequency, the higher loss while in the case of same frequency, the larger a parasitic capacitance value, the higher loss. In other words, when compared in the same structure, the smaller a parasitic inductance value, the smaller loss.

The problems of each of the above-mentioned prior arts are listed up below.

In the first prior art, since a parasitic capacitance value increases by disposing a plurality of capacitors on a soldered pattern, an RF characteristic degrades.

In the second prior art, since parasitic inductance occurs due to a line (Au ribbon) 44 used to connect capacitors 41 and 45 and also the parasitic inductance value is essentially proportional to the length of the line, an RF characteristic is restricted according to the line length.

In the third prior art, in order to obtain a sufficient capacitance value as DC cut, the end part of each transmission line pattern must be met each other in the form of a comb of several tens of micrometers by fine processing. Therefore, such fine processing is difficult to make from the viewpoint of processing accuracy.

In the fourth prior art, when connecting the pattern 51 provided on one surface and the pattern 52 provided on the other surface by a veer 53, a band is restricted by the characteristic of the veer 53 and also both-surface wiring around the mounting place of the capacitors 54 and 55 and impedance matching in the veer 53 part are very difficult to make. Therefore, an RF characteristic cannot be secured.

As described above, in order to obtain a good RF characteristic across a broad band while improving the characteristic, each of the above-mentioned parasitic elements (parasitic capacitance and parasitic inductance) must be set low.

In order to obtain a good characteristic in a desired band, for example, across a broad band, it is preferable to be able to easily adjust each parameter, such as line width and the like, in a DC cut structure. In such adjustment, for example, the size of a related place can be modified so as to meet predetermined conditions according to the modification of the line width.

In order to obtain a good characteristic in a desired band, the continuity of the DC cut, for example, the fact that line width can be constant as much as possible, is also important.

SUMMARY OF THE INVENTION

The first object of the present invention is to provide a simply structured DC cut structure capable of realizing a desired frequency characteristic.

The second object of the present invention is to provide an inexpensive DC cut structure capable of realizing a desired frequency characteristic.

The third object of the present invention is to provide a manufacturing method suitable for mass-production, of a circuit substrate with a DC cut structure capable of realizing a desired frequency characteristic.

In the first DC cut structure of the present invention, two capacitors are provided in parallel between signal transmission line patterns facing each other on the substrate, and one of the two capacitors are electrically connected to each surface of each transmission line pattern exposed through a hole part provided on the substrate.

It is preferable for the two capacitors to have different capacities.

In the second DC cut structure of the present invention, one capacitor is provided between signal transmission line patterns facing each other on the substrate, and the capacitor is electrically connected to either surface of each transmission line pattern exposed through a hole part provided on the substrate.

BRIEF DESCRIPTION OF THE DRAWINGS

FIG. 1 shows the frequency characteristic of two capacitors used for the DC cut structure;

FIG. 5 shows the simulation results of the influence on an RF characteristic of each parasitic element shown in FIG. 4;

FIG. 8B shows the frequency characteristic of the DC cut structure of the second prior art shown in FIG. 2;

FIG. 8C shows the frequency characteristic of the DC cut structure of the fourth prior art shown in FIG. 3;

FIG. 9 shows an application example of the DC cut structure in the preferred embodiment (No. 1)

DESCRIPTION OF THE PREFERRED EMBODIMENTS

Figure 2:
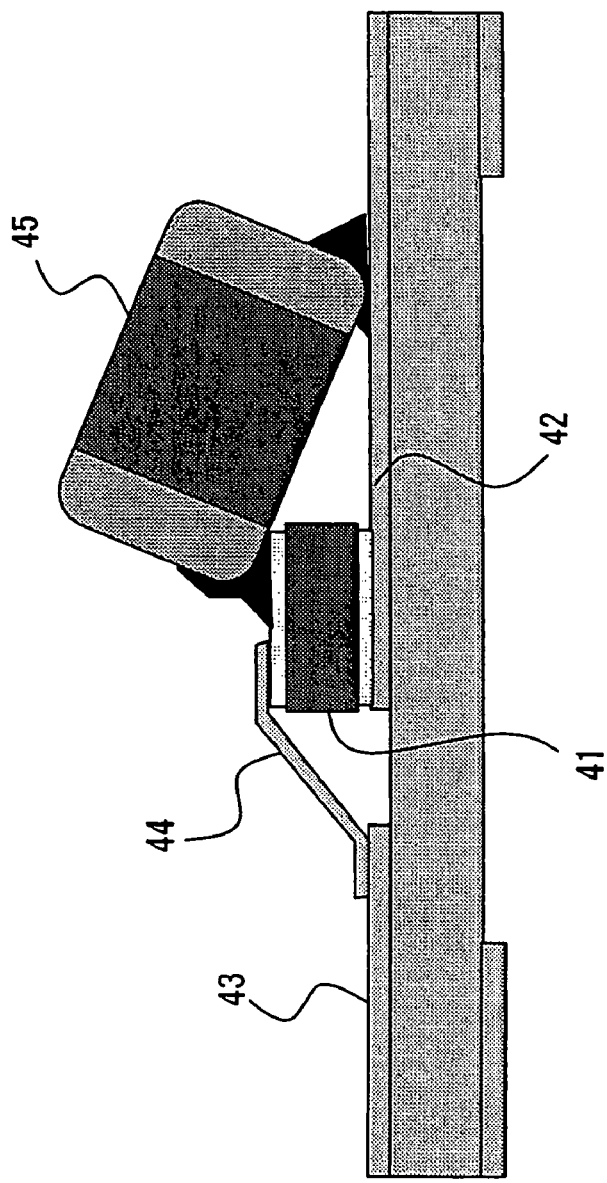
FIG. 2 shows the DC cut structure of the second prior art.

The preferred embodiments of the present invention are described in detail below with reference to the drawings.

In the DC cut structure of the present invention, two capacitors are provided in parallel between signal transmission line patterns facing each other on the substrate, and one of the two capacitors are electrically connected to each surface of each transmission line pattern exposed through a hole part provided on the substrate.

In the DC cut structure of the present invention, a part of each transmission line pattern is exposed through a hole part provided on a substrate, and a capacitor connects the exposed transmission line patterns on each surface. Thus, the parallel connection structure of two capacitors is formed. Thus, compared with the DC cut structure of the second prior art shown in FIG. 2, for example, the DC cut structure of the present invention has no Au ribbon 44. Compared with the DC cut structure of the fourth prior art shown in FIG. 3, the DC cut structure of the present invention has a simple structure without any veer 53. Since the DC cut structure of the present invention is so simple, each parameter, such as line width and the like can be easily set optimally in the realization of a desired frequency characteristic. Therefore, by using inexpensive capacitors, such as ceramic capacitors, a sufficient frequency characteristic can be obtained, and accordingly, a desired frequency characteristic can be realized at a low cost.

By using capacitors with different capacity values for the two capacitors, the DC cut structure can cover a broad band. In this case, a simply-structured DC cut structure which can respond to a broad band can be obtained.

In the manufacturing method of a circuit substrate with the DC cut structure of the present invention, two capacitors are provided in parallel between signal transmission line patterns facing each other on the substrate. The manufacturing method comprises a cutting process of providing a hole part for the capacitor joint part of the substrate, a mounting process of exposing a part of each of the transmission line patterns through the hole part and mounting each transmission line pattern on the substrate and a connection process of electrically connecting one of the capacitors to the exposed part of each transmission line pattern on each surface. As the mounting process, the manufacturing process of a flexible substrate is used.

In this case, since the manufacturing process of a flexible substrate can be used as the mounting process, such an exposed part (flying-lead part) of the hole part can be easily generated. Accordingly, the mounting process is suitable for mass production.

In the DC cut structure of the present invention, the parallel connection structure of two capacitors is formed by exposing a part of the transmission line pattern through the hole part provided on the substrate, and connecting a capacitor to the exposed transmission line pattern on each surface. Therefore, the DC cut structure of the present invention is simple. In the DC cut structure of the present invention, each parameter, such as line width and the like can be easily set optimally in the realization of a desired frequency characteristic. Therefore, by using inexpensive capacitors, such as ceramic capacitors, a sufficient frequency characteristic can be obtained, and accordingly, a desired frequency characteristic can be realized at a low cost.

In the manufacturing method of a circuit substrate with the DC cut structure of the present invention, since the manufacturing process of a flexible substrate can be used as the mounting process, such an exposed part (flying-lead part) of the hole part can be easily generated. Accordingly, the mounting process is suitable for mass production.

Figure 6:
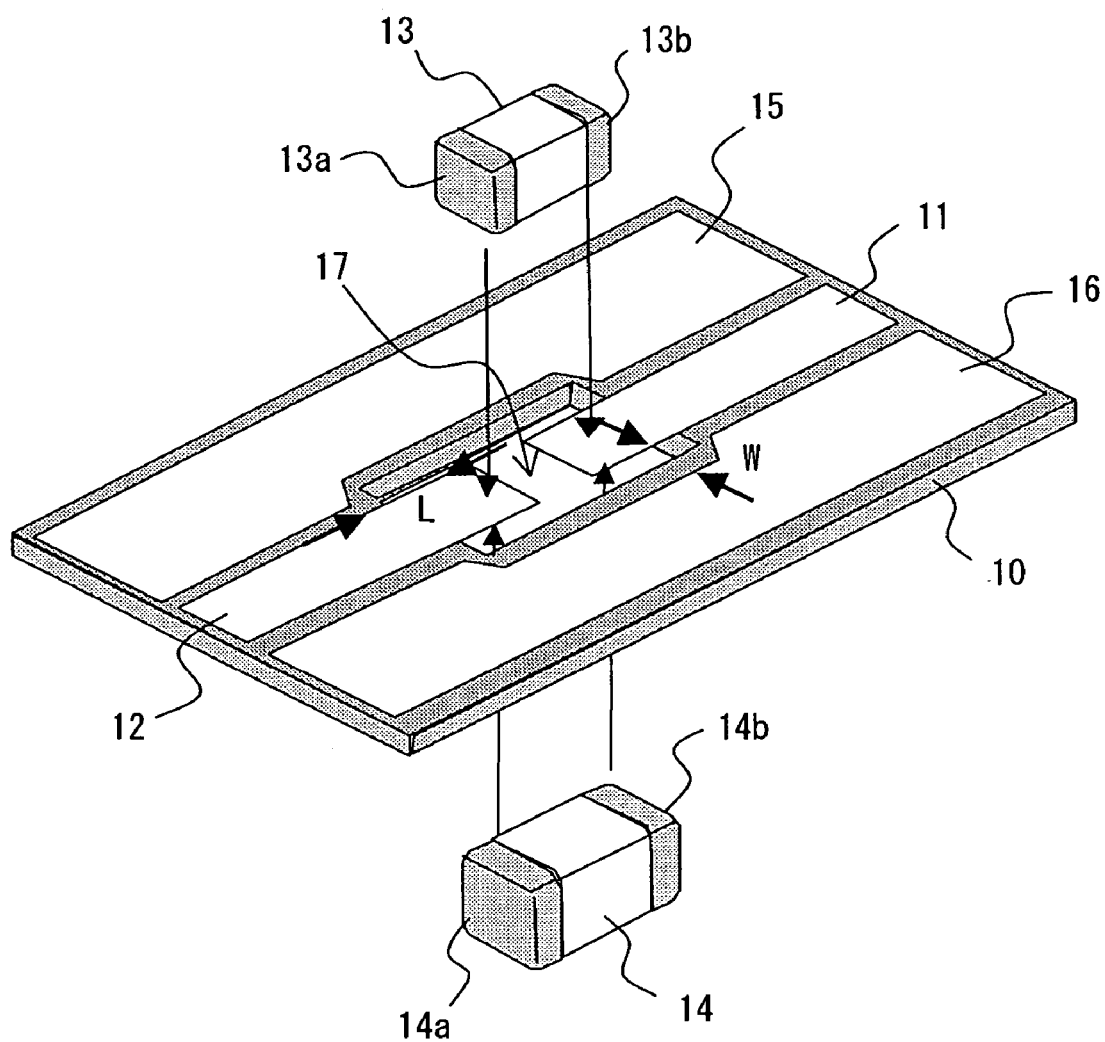
FIG. 6 shows the DC cut structure in one preferred embodiment of the present invention.

FIG. 6 shows the DC cut structure in one preferred embodiment of the present invention.

In the DC cut structure of FIG. 6, two capacitors 13 and 14 with different capacities are connected to signal transmission line patterns 11 and 12 facing each other on a substrate 10 in parallel. In FIG. 6, for example, a capacitor with a large physical size and one with a small physical size correspond to a capacitor with large capacity and one with small capacity, respectively.

One of the capacitors 13 and 14 is electrically connected to each surface of each exposed transmission line patterns 11 and 12 through the hole part provided on the substrate.

On the substrate 10, a coplanar line in which the transmission line patterns 11 and 12 are pinched by ground patterns 15 and 16 on one surface of the substrate is adopted for pattern disposition. A hole part 17 whose size is large enough to sufficiently join capacitor 13 or 14 to the substrate 10 without contacting them is provided between the patterns, for example, by applying cutting to the corresponding part of the substrate 10. This hole part 17 has a flying-lead shape exposing a part of the transmission line patterns 11 and 12. A structure in the vicinity of such a hole part can be collectively formed with high accuracy in a process used to manufacture a flexible substrate, such as a polyimide substrate and the like.

Then, one of two capacitors 13 and 14 with different capacity values are electrically connected to each surface of the respective exposed parts of the transmission line patterns 11 and 12, using solder, Ag epoxy resin or the like. Specifically, the capacitor 13 is connected to one surface of the respective exposed parts of the transmission line patterns 11 and 12 in such a way that electrodes 13a and 13b provided in each end part of the capacitor 13 may touch the corresponding transmission line pattern 11 and 12, respectively, or vice versa. In FIG. 6, the electrodes 13a and 13b are connected to one surface of the transmission line pattern 12 and one surface of the transmission line pattern 11, respectively. Similarly, the capacitor 14 is connected to the other surface of the respective exposed parts of the transmission line patterns 11 and 12 in such a way that electrodes 14a and 14b provided in each end part of the capacitor 14 may touch the corresponding transmission line pattern 11 and 12, respectively, or vice versa. In FIG. 6, the electrodes 14a and 14b are connected to the other surface of the transmission line pattern 12 and the other surface of the transmission line pattern 11, respectively.

Figure 3:
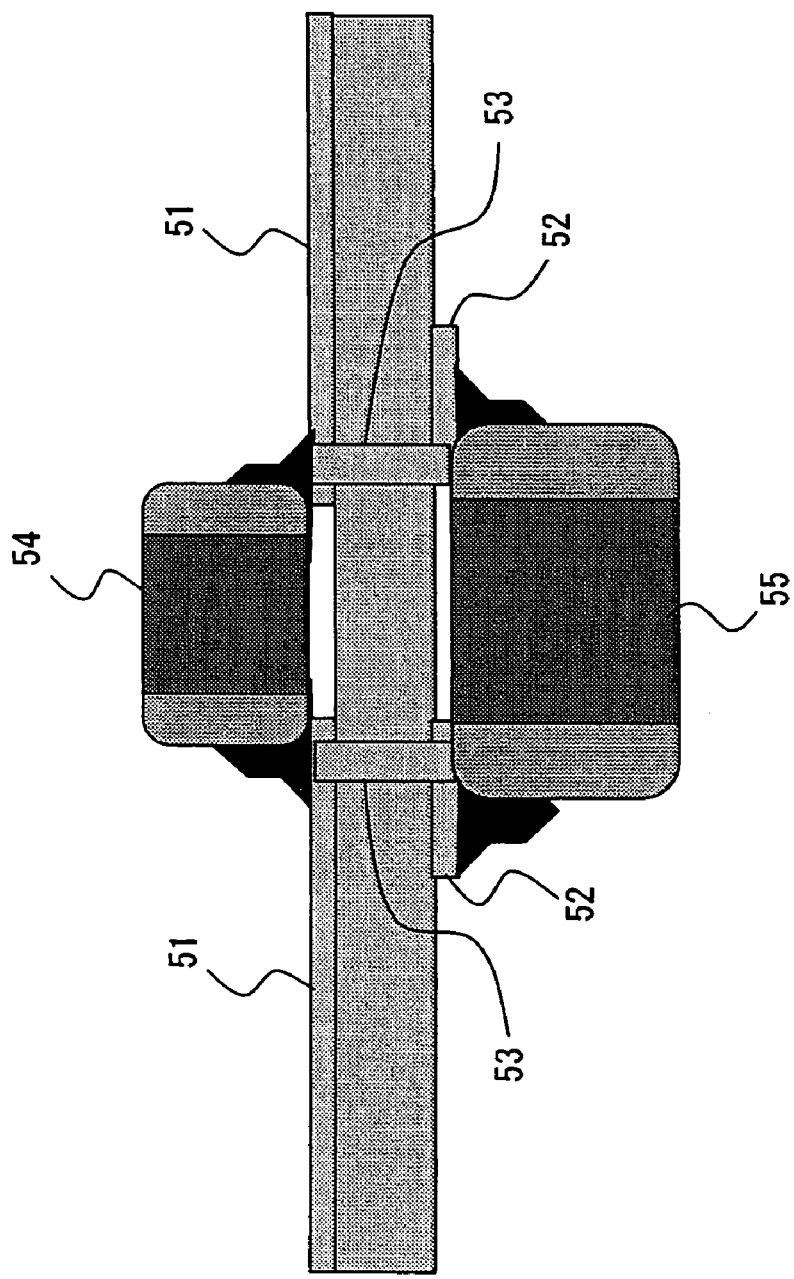
FIG. 3 shows the DC cut structure of the fourth prior art.
Figure 4:
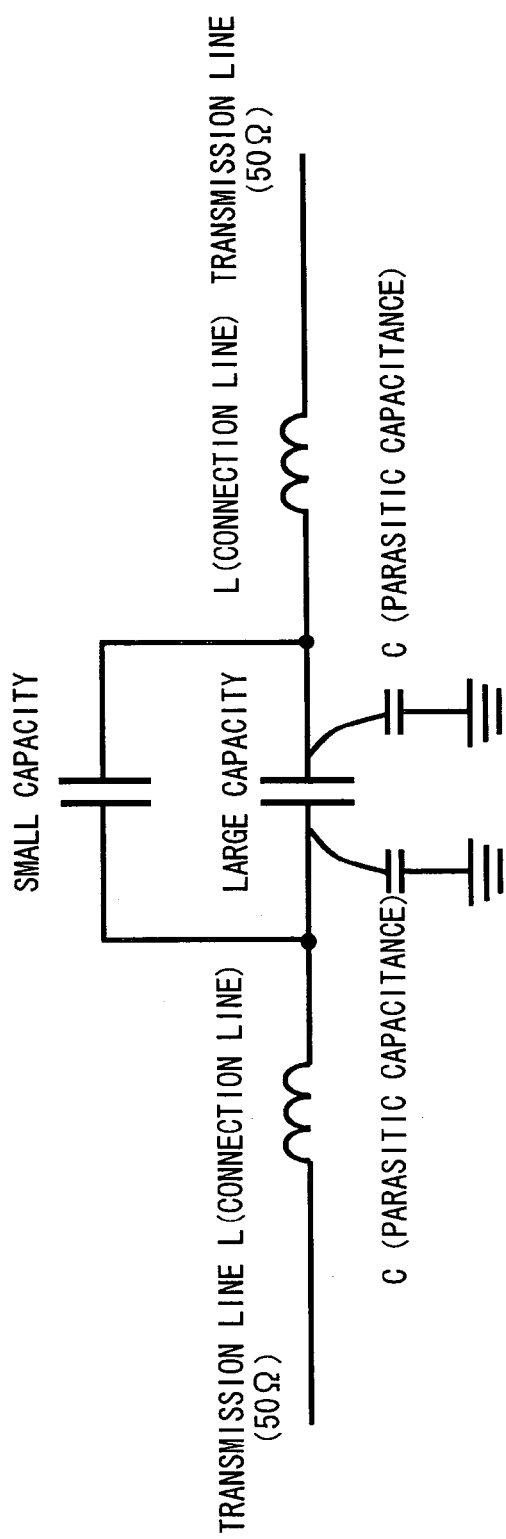
FIG. 4 shows an equivalent circuit with the DC cut structure.

As described above, compared with the DC cut structure of the second prior art shown in FIG. 2, the DC cut structure of the present invention, for example, has no Au ribbon 44, and compared with the DC cut structure of the fourth prior art shown in FIG. 3, it is simple without any veer 53.

If capacitors having the same width in the direction vertical to the transmission line are used for capacitors 13 and 14, and the respective width of the transmission line patterns 11 and 12 is matched with the width of the capacitors, the above-mentioned continuity can be secured. However, if capacitors with different widths are used for the capacitors 13 and 14, the respective width of the transmission line patterns 11 and 12 can also be set to between the different widths or preferably around the average (including the average).

Since the DC cut structure of the present invention is simple, each parameter, such as line width and the like can be easily set optimally in the realization of a desired frequency characteristic. Therefore, by using inexpensive capacitors, such as ceramic capacitors, a sufficient frequency characteristic can be obtained, and accordingly, a desired frequency characteristic can be realized at a low cost. As shown in FIG. 6, if the two capacitors have different capacity values, the DC cut structure can cover a broad band.

As other more general factors in determining the band characteristic of the DC cut structure, the following two factors can be considered.

(1) Transmission line characteristic
(2) Length of an impedance mis-matching part (parasitic capacitance element and parasitic inductance element)

The transmission line characteristic in (1) above generally depends on the permittivity and dielectric loss of a substrate. However, a transmission line having a good characteristic across a broad band can be generated using a substrate with low permittivity and low dielectric loss, such as a polyimide substrate or the like. As to the impedance mis-matching in (2) above, the parasitic inductance element can be suppressed as much as possible by setting the length L of the exposed part of each of the transmission line patterns 11 and 12, corresponding to the parasitic inductance element, as short as possible as long as each of the capacitors 13 and 14 can be connected to both of the transmission line patterns 11 and 12. More accurately, the length L of the exposed part is defined to be a distance between a point where the ground pattern gets away from the transmission line pattern and the end part of the capacitor with a larger physical size.

As to parasitic capacitance which is determined by the physical size of a capacitor connected to the transmission line pattern, width W between the transmission line pattern and the ground pattern in the parallel connection part of capacitors is set to an appropriate value so that a usually predetermined distributed constant, such as 50 ohms is satisfied in such a transmission line while taking into consideration balance with other adjustable parameters. Then, the optimal combination of these parameters is obtained by conducting experiments variably changing each of the adjustable parameters or referring to the simulation result of a simulator.

Figure 7:
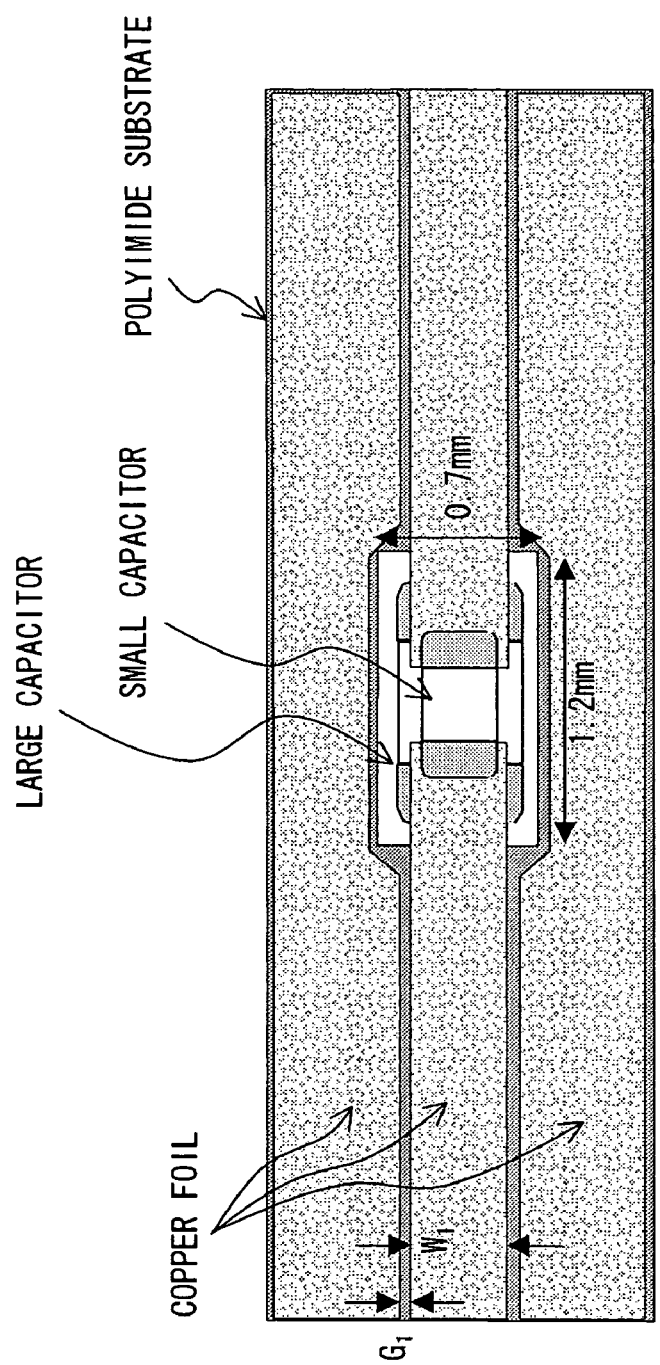
FIG. 7 shows an example of the dimensions and weight of the DC cut structure of the preferred embodiment that are obtained as the result of the simulation.

FIG. 7 shows an example of the dimensions and weight of the DC cut structure in the preferred embodiment that are, for example, obtained as the result of the simulation.

In FIG. 7, the dimensions of each part of the DC cut structure are set depending on the type of a dielectric (substrate), the thickness of the dielectric (substrate) and the thickness of copper foil (pattern) In this example, the respective weights of two capacitors are 1.5 mg and 0.3 mg, the thickness of a substrate (polyimide) is 50 μm and the width of a transmission line pattern (cooper foil) is 25 μm. a gap ($G_1$) between the transmission line pattern and the ground pattern and the width ($W_1$) of the transmission line pattern are determined to be 40 μm and 390 μm, respectively, by a simulation using those dimensions. In this example, since the weight of a capacitor mounted on a flying lead is several milli-grams, it is considered that the DC cut structure can be manufactured from the viewpoint of strength. In FIG. 7, the dimensions of a hole part provided for the connection part of the capacitor to the pattern on the substrate are 1.2 mm long and 0.7 mm wide.

Figure 8A:
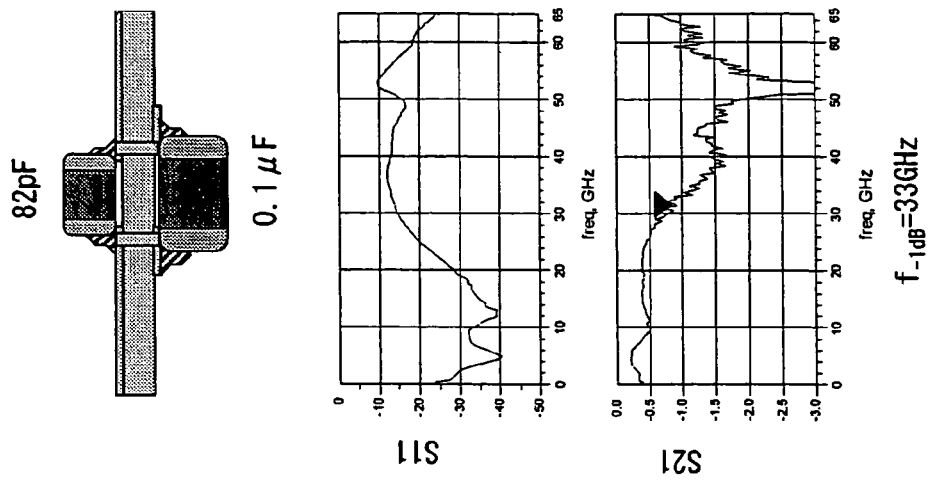
FIG. 8A shows the frequency characteristic of the DC cut structure of the preferred embodiment.
Figure 8A:
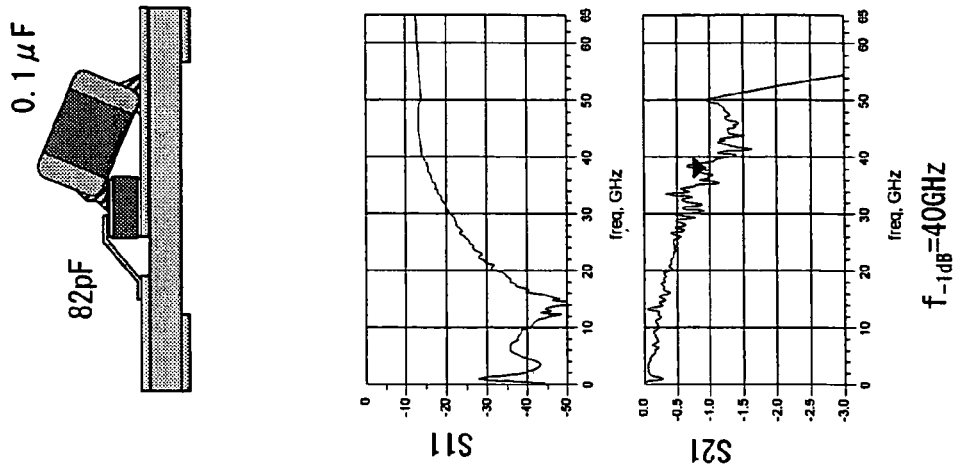
Figure 8A:
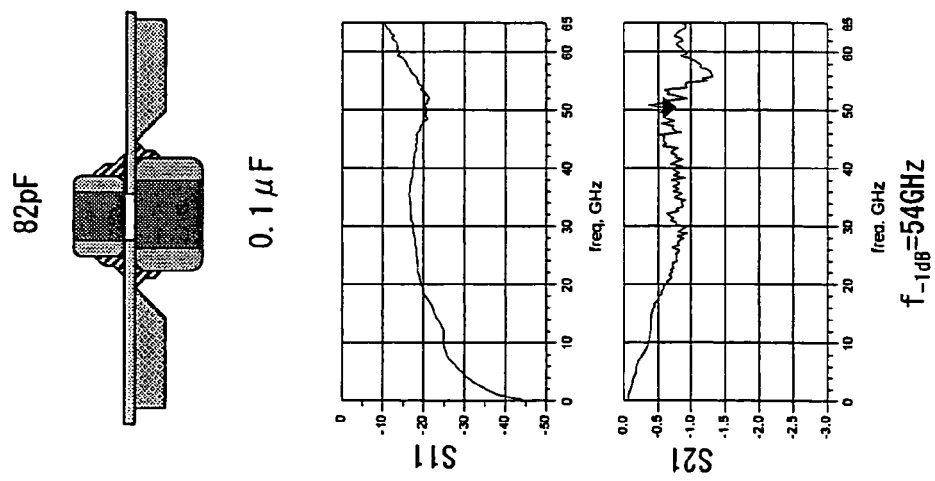

In FIGS. 8A, 8B and 8C, the frequency characteristic of the DC cut structure in the preferred embodiment is compared with that of the conventional DC cut structure. FIGS. 8A, 8B and 8C show the frequency characteristic of the DC cut structure in the preferred embodiment, that of the DC cut structure of the second prior art shown in FIG. 2 and that of the DC cut structure of the fourth prior art shown in FIG. 3, respectively, together with the section view of its corresponding DC cut structure.

Each graph provided in the upper and lower sections of each of FIGS. 8A through 8C shows a frequency characteristic against an S parameter indicating how much the capacitance and inductance elements are conveyed. The upper graph shows a S11 parameter, that is, the loss (unit: dB) of a signal (reflected wave) that is inputted and outputted from port 1 against a frequency (unit: GHz). The lower graph shows S21 parameter, that is, the loss (unit: dB) of a signal (transmitted wave) that is inputted from port 1 and is outputted from port 2 against a frequency (unit: GHz).

In particular, the lower graph of S21 is often used to show the frequency characteristic of the DC cut structure. In FIGS. 8A through 8C, the graph shows the threshold value of a frequency in which the loss of the transmitted wave exceeds "−1 dB", in other words, the absolute value of loss exceeds "1 dB" and that the value is smaller than "−1 dB". Since a DC cut structure with a larger threshold value of this can suppress loss to a low level across a broader band, it can be said to be a better DC cut structure that can be cover a broader frequency band.

In the DC cut structure of the present invention shown in FIG. 8A, this threshold value is "54 GHz", and is larger than the threshold value "40 GHz" of the DC cut structure of the second prior art shown in FIG. 8B and that "33 GHz" of the DC cut structure of the fourth prior art shown in FIG. 8C.

The DC cut structure of the present invention shown in FIG. 8A is obtained using one of a plurality of segments of data set by the above-mentioned simulation, where parameters are not especially optimized. However, compared with the prior art, a sufficiently good frequency characteristic is obtained using the same combination of capacitor values (82 pF and 0.1 μF).

FIG. 9 shows an application example of the DC cut structure of the preferred embodiment (No. 1).

In the DC cut structure of FIG. 9, coplanar line disposition is adopted for a predetermined section including a capacitor connection part on a substrate. However, a conversion part from the coplanar line into a micro-strip line on one surface of which a transmission line pattern is provided and on the other surface a ground pattern is provided or a conversion part from the coplanar line into a grounded coplanar line on one surface of which a transmission line pattern is provided and on each surface of which a ground pattern is provided, is provided for the end part excluding the predetermined section on the substrate. Thus, the DC cut structure of the preferred embodiment can be easily connected to another form of a transmission line (micro-strip line, grounded coplanar line).

Figure 10:
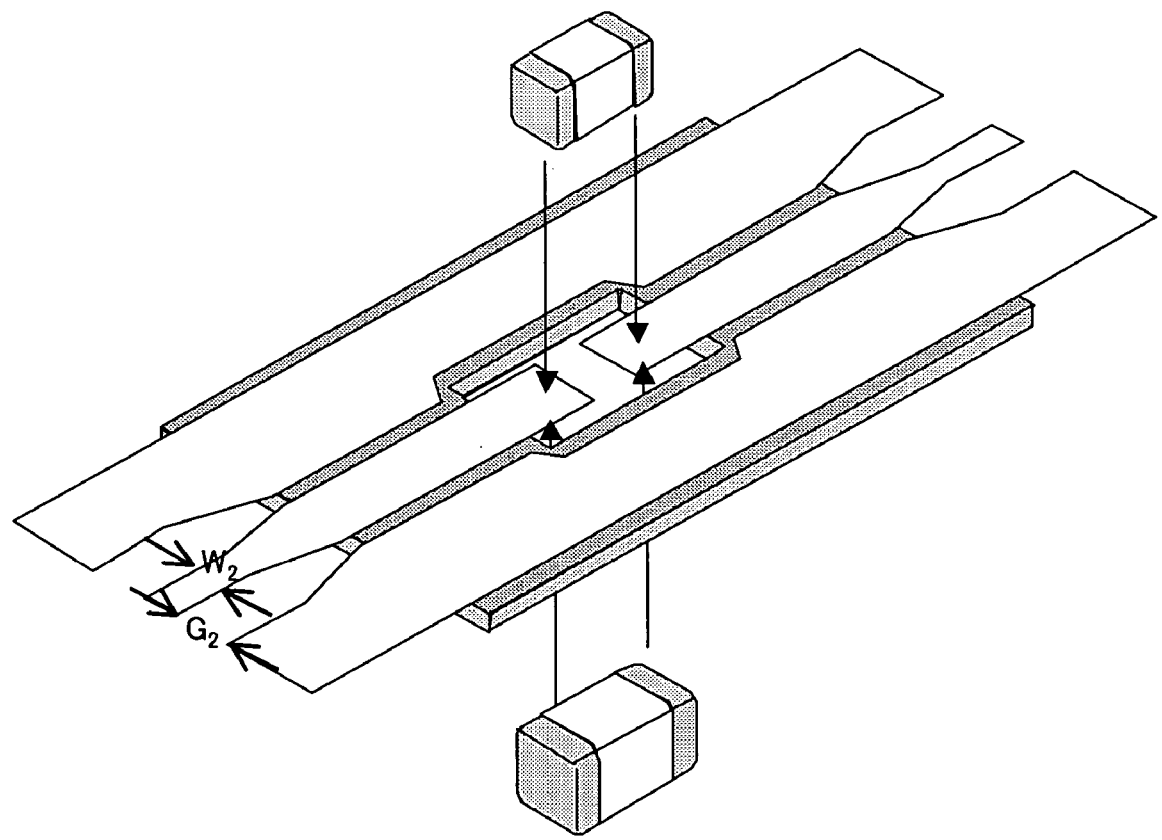
FIG. 10 shows an application example of the DC cut structure in the preferred embodiment (No. 2).

FIG. 10 shows an application example of the DC cut structure of the preferred embodiment (No. 2).

In the DC cut structure of FIG. 10, although coplanar line disposition is adopted for the predetermined section including a capacitor connection part on the substrate, a flying lead is provided for the end part excluding the predetermined section. It is preferable to match at least a part of the pattern width of the flying lead part of the end part to the pattern width on the substrate of a connection party.

For example, in FIG. 10, both the width $W_2$ Of the transmission line pattern of the flying lead part, and a gap $G_2$ between the transmission line pattern of the flying lead part and the ground pattern are matched with the line of a connection party.

If an RF signal travels through a transmission line pattern, the difference in pattern width between corresponding patterns in a connection part with another substrate affects a frequency characteristic (RF characteristic). Therefore, by matching the width in a connection part, the RF characteristic in the connection part can be improved.

By applying Au plating to the flying lead part, the substrate can be directly connected to another substrate or a device by bonding.

Although in the above description, the DC cut structure has been considered to be one unit which can be attached to a circuit substrate, an IC package and the like, such a DC cut structure can also be built in a circuit substrate or a part of an IC package at the time of manufacture.

For example, the DC cut structure of the preferred embodiment can be used for the DC cut structure part of an RF circuit substrate in which a DC cut structure is used on an RF signal line or of an IC package in which a DC cut structure is used on an RF signal wiring in an interposer mounting an IC.

Although in the above description, pattern disposition by a co-planar line is applied to the substrate, other disposition, such as amicro-strip line or a grounded co-planar line can also be adopted as the pattern disposition.

In that case, the end part of the substrate can also have a conversion part from a pattern used in a capacitor connection part on the substrate into another pattern different from the used pattern.

Although in the above description, each of two capacitors with different capacities is connected to each surface of the transmission line pattern exposed through the hole part on the substrate, capacitors with the same capacity can also be used for the capacitors when there is no need to cover such a broad band in connection with a used band.

For the same reason, if there is no need to cover such a broad band, the number of capacitors to be provided between exposed transmission line patterns in order to connect them can also be one. In that case, the capacitor is provided between the exposed transmission patterns on either surface in order to electrically connect them.

The manufacturing method of a circuit substrate using the DC cut structure of the preferred embodiment comprises as a part related to the manufacture of the DC cut structure a cutting process of providing a hole part for the connection part of two capacitors on a substrate, a mounting process of exposing a part of each of the transmission line patterns to the hole part and mounting each transmission line pattern on the substrate and a connection process of electrically connecting one of the capacitors to the exposed part of each transmission line pattern on each surface. Since the manufacturing process of a flexible substrate can be used as the mounting process, such an exposed part (flying-lead part) of the hole part can be easily generated. Accordingly, the mounting process is suitable for mass production.

Even in this case, if as described above, there is no need to cover such a broad band, only one capacitor can also be provided between exposed transmission line patterns to connect them. In that case, the manufacturing method of the DC cut structure comprises a cutting process of providing a hole part for the connection part of the capacitor on a substrate, a mounting process of exposing a part of the respective transmission line patterns through the hole part and mounting the transmission line patterns on the substrate and a connection process of electrically connecting the capacitor to either surface of the respectively exposed part of the transmission line patterns. Since the manufacturing process of a flexible substrate can be used as the mounting process, such an exposed part (flying-lead part) of the hole part can be easily generated. Accordingly, the mounting process is suitable for mass production.

What is claimed is:

1. A direct current cut structure in which two capacitors are provided in parallel between signal transmission line patterns facing each other on a substrate, wherein
the two capacitors are electrically connected to each surface of each transmission line pattern that is exposed through a hole part provided on the substrate.

2. The direct current cut structure according to claim 1, wherein the two capacitors have different capacity values.

3. The direct current cut structure according to claim 1, wherein
the two capacitors both are ceramic capacitors.

4. The direct current cut structure according to claim 1, wherein
a co-planar line in which a ground pattern is provided on a surface provided with transmission line patterns in such a way as to pinch the transmission line patterns is applied to pattern disposition.

5. The direct current cut structure according to claim 1, wherein
a co-planar line in which a ground pattern is provided on a surface provided with transmission line patterns in such a way as to pinch the transmission line patterns is used as patterns of a predetermined section including a capacitor connection part on the substrate.

6. The direct current cut structure according to claim 5, wherein
a conversion part to a micro-strip line in which transmission line patterns and a ground pattern are provided on one and the other surfaces, respectively, is provided in an end part excluding a predetermined section on the substrate from the co-planar line.

7. The direct current cut structure according to claim 5, wherein
a conversion part to a grounded co-planar line in which transmission line patterns are provided on one surface and a ground pattern is provided on each surface, respectively, is provided in an end part excluding the predetermined section on the substrate from the co-planar line.

8. The direct current cut structure according to claim 5, wherein
a flying lead is provided in an end part excluding a predetermined section on the substrate.

9. The direct current cut structure according to claim 8, wherein
at least a part of the pattern width of a flying lead part of the end part is matched with the pattern width on a substrate of a connection party.

10. The direct current cut structure according to claim 1, wherein
the respective capacity of the two capacitors is set to the same value.

11. The direct current cut structure according to claim 1, wherein
the width of each of the transmission line pattern is set between the respective widths of the two capacitors.

12. The direct current cut structure according to claim 1, wherein
one of a co-planar line in which a ground pattern is provided in such a way as to pitch the transmission line patterns, a micro-strip line in which transmission line patterns and ground pattern are provided on one and the other surfaces and a grounded co-planar line in which transmission line patterns are provided on one surface and a ground pattern is provided on each surface, is used as the pattern disposition of the predetermined section including a capacitor connection part on the substrate.

13. The direct current cut structure according to claim 12, wherein
a conversion part to another pattern different from a used pattern is provided in the end part excluding the predetermined section on the substrate from the pattern used in the predetermined section.

14. A direct current cut structure in which one capacitor is provided between signal transmission line patterns facing each other on a substrate, wherein
the capacitor is electrically connected to either surface of each transmission line pattern that is exposed through a hole part provided on the substrate.

15. A radio frequency (RF) circuit substrate in which the direct current cut structure set forth in claim 1 is used on an RF signal line.

16. An IC package in which the direct current cut structure set forth in claim 1 is used on the RF signal line of an interposer on which ICs are mounted.

17. A manufacturing method of a circuit substrate including a direct current cut structure in which two capacitors are provided in parallel between signal transmission line patterns facing each other on a substrate, comprising:
providing a hole part for a connection part of two capacitors on the substrate;
exposing a part of each of the transmission line patterns through the hole part and mounting each of the transmission line patterns on the substrate; and
electrically connecting each of the capacitors to each surface of the exposed part of each of the transmission line patterns, and
a manufacturing process of a flexible substrate is used as the mounting process.

18. A manufacturing method of a circuit substrate including a direct current cut structure in which one capacitor is provided between signal transmission line patterns facing each other on a substrate, comprising:
providing a hole part for a connection part of two capacitors on the substrate;
exposing a part of each of the transmission line patterns through the hole part and mounting each of the transmission line patterns on the substrate; and
electrically connecting the capacitor to either surface of the exposed part of each of the transmission line patterns, and
a manufacturing process of a flexible substrate is used as the mounting process.

19. A radio frequency (RF) circuit substrate in which the direct current cut structure set forth in claim 14 is used on an RF signal line.

20. An IC package in which the direct current cut structure set forth in claim 14 is used on the RF signal line of an interposer on which ICs are mounted.

* * * * *

UNITED STATES PATENT AND TRADEMARK OFFICE
CERTIFICATE OF CORRECTION

PATENT NO. : 7,046,100 B2  
APPLICATION NO. : 10/944181  
DATED : May 16, 2006  
INVENTOR(S) : Takatoshi Yagisawa et al.

Page 1 of 1

It is certified that error appears in the above-identified patent and that said Letters Patent is hereby corrected as shown below:

Column 10, Line 4, change "pitch" to --pinch--.

Signed and Sealed this

Twenty-first Day of November, 2006

JON W. DUDAS  
*Director of the United States Patent and Trademark Office*